United States Patent [19]

Mollet et al.

[11] Patent Number: 4,737,620

[45] Date of Patent: Apr. 12, 1988

[54] METHOD OF MANUFACTURING CARDS HAVING AN ELECTRONIC MEMORY AND CARDS OBTAINED BY PERFORMING SAID METHOD

[75] Inventors: Jean-Paul Mollet, La Celle St Cloud; Alain Rebjock, Cergy; Jean-Louis Hayart, Malakoff, all of France

[73] Assignee: Flonic, Montrouge, France

[21] Appl. No.: 844,039

[22] Filed: Mar. 25, 1986

[30] Foreign Application Priority Data

Mar. 28, 1985 [FR] France .................. 85 04658

[51] Int. Cl.4 ............................ G06K 19/06
[52] U.S. Cl. ................... 235/492; 235/488; 29/831
[58] Field of Search ............ 235/488, 492; 361/380; 29/831, 835, 841

[56] References Cited

U.S. PATENT DOCUMENTS 4,216,577  8/1980  Badet et al. .................... 29/831
4,463,971  8/1984  Hoppe et al. .................. 235/488 X
4,483,067 11/1984  Parmentier .................... 235/492 X
4,625,102 11/1986  Rebjock et al. ................ 235/488 X Primary Examiner—David L. Trafton
Attorney, Agent, or Firm—Dale Gaudier

[57] ABSTRACT

In oder to improve fixing between an electronic module (140) and the body (120) of a credit card made of plastic material, a housing (122, 134) is provided in the card body with bumps (130, 132) projecting into the housing. The electronic module (140) is pressed against the bumps (130, 132) while being raised to the softening temperature of the material from which the bumps are made. The module is pressed until its contact tabs (148) are level with the face (126) of the body. Fixing is completed by causing a glue to penetrate by capilarity between the bottom (124), the insulating substrate (142) of the electronic module, and the bumps (130, 132). The invention is particularly applicable to prepaid credit cards.

13 Claims, 4 Drawing Sheets

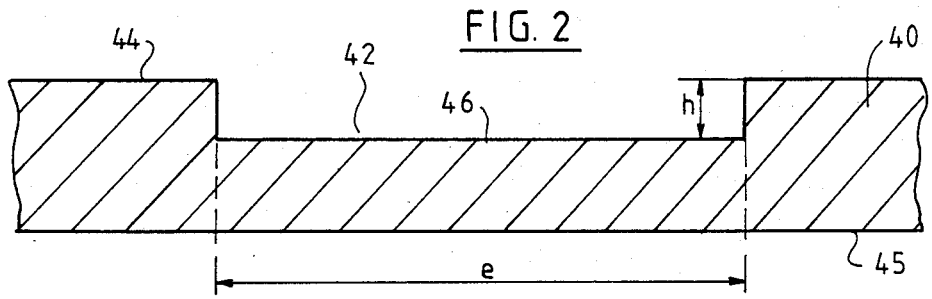
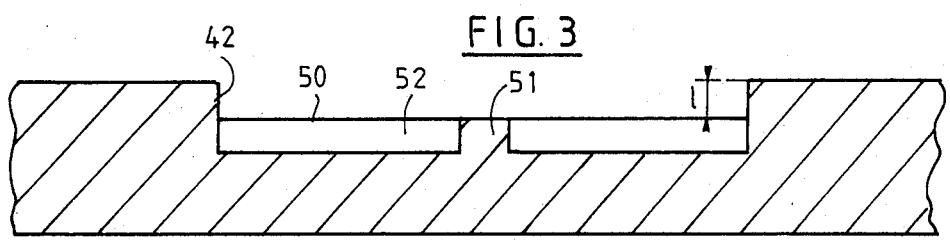
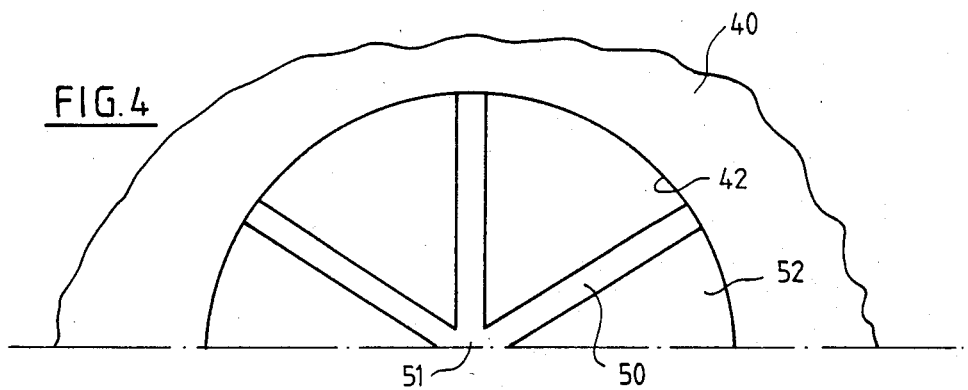
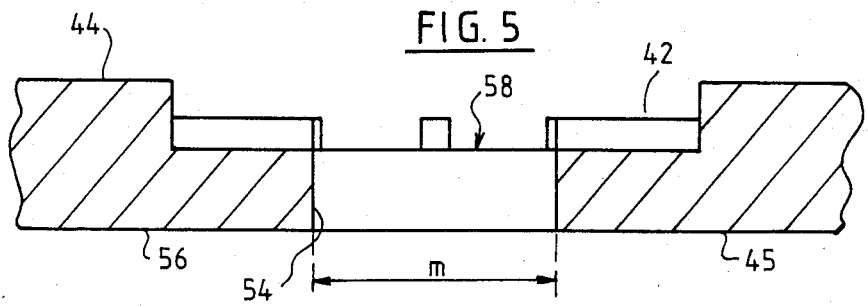

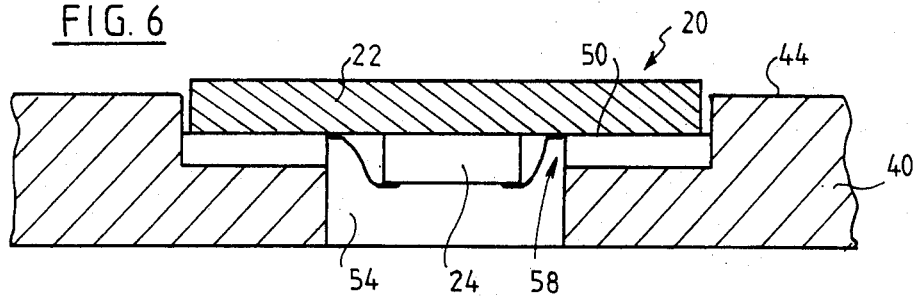
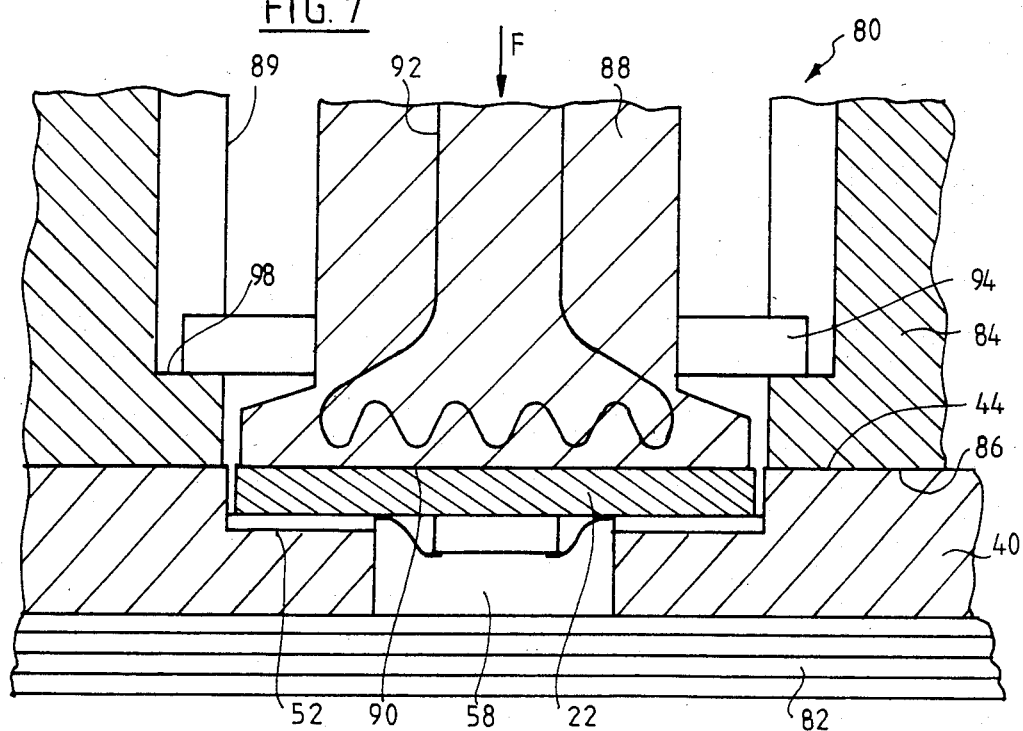
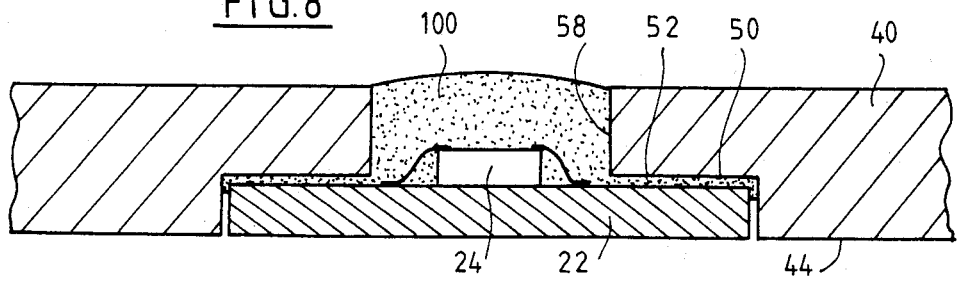

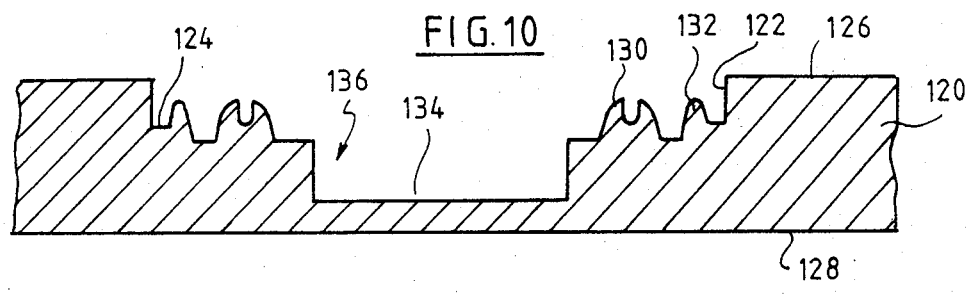
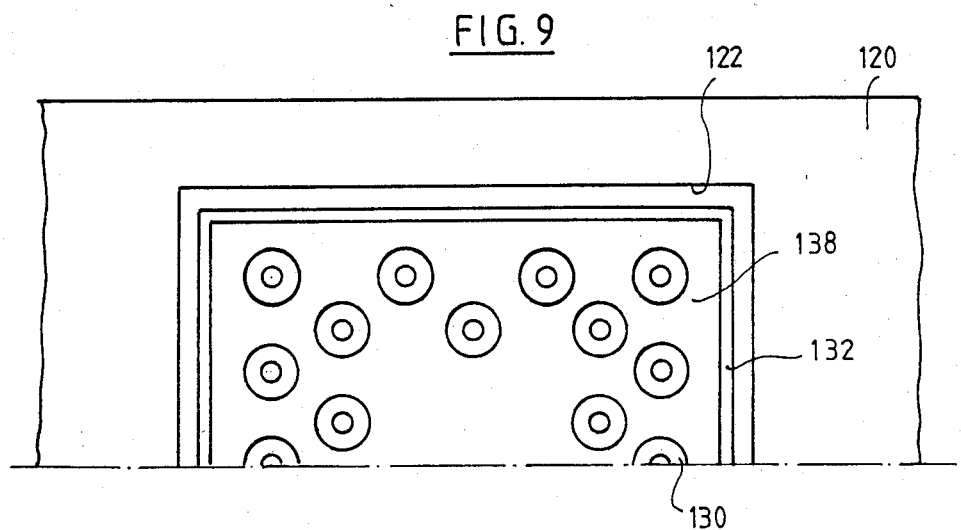
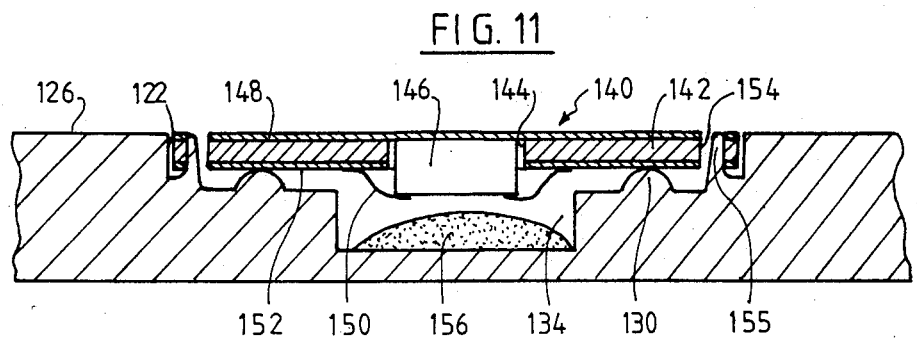

METHOD OF MANUFACTURING CARDS HAVING AN ELECTRONIC MEMORY AND CARDS OBTAINED BY PERFORMING SAID METHOD

The present invention relates to a method of manufacturing cards having an electronic memory of the integrated circuit type, and to cards obtained by performing the said method.

BACKGROUND OF THE INVENTION

Electronic memory cards enabling their owners to perform certain kinds of transaction are well known. There are two broad categories of such cards. Some cards have an electronic circuit which is sufficiently complex to enable credit data to be reloaded into the card memory. In other words, once the initial credit in the card has been spent, the user can have the card "reloaded" with a new amount of credit in return for suitable payment. A second or "prepaid" type of card contains a simpler electronic circuit and the card is loaded once only with a given amount of credit. Once this credit has been spent by the user, the card must be thrown away.

Since prepaid cards are used once only, it will be understood that they must be as cheap as possible to manufacture in order to avoid the cost of the card being excessive in relation to the necessarily small amount of credit which it is capable of storing. Low cost is achieved, in part, by the electronic circuit itself being considerably cheaper than the circuit used in a re-loadable card. However, the cost of manufacturing the card itself is a non-negligible quantity in the final cost of the card. Such a card is essentially constituted by a body made of plastic material, and an electronic module lodged therein, said module comprising the integrated circuit, contact tabs for providing connection with a card reader, and electrical connections between the integrated circuit and the contact tabs. The electronic module is fixed in the body of the card in a manner which is capable of ensuring that the resulting assembly can pass bending tests to which the card is subjected. In addition, the thickness of the card it standardized and this thickness is about one millimeter. It will be understood that this small thickness increases the difficulty of installing and fixing an electronic module in the card.

Various methods of implanting the electronic module in the body of the card have already been proposed. In a first method, the electronic module is placed between two layers of plastic material which constitute the card body, and the assembly is thermocompressed in order to obtain the final card shape, with the integrated circuit being buried in the body of the card.

In another method, a prefabricated card body is taken and a cavity is machined therein to receive the electronic module which is held in place by glue. Such a technique is very difficult to perform since the machining must be performed with high accuracy in order to ensure that the contact terminals of the electronic module are level with the surface of the card body after the module has been placed in the cavity.

In order to remedy these drawbacks, European patent application No. 128 822 proposes a method of implanting an electronic module in the body of the card by providing a cavity in the card body with the cavity being smaller than the outside dimensions of the electronic module, the body of the card is then locally heated while the electronic module is pressed against the card body so that at least a portion of the electronic module serves as a punch which defines parts of the card cavity. Partial melting of the plastic material making up the card body provides very secure anchoring of the electronic module in the card body and in addition avoids any need for accurate machining of the body.

In order to further improve the implantation of the electronic module in the card, preferred implementations of the present invention provide a method of implanting the electronic module in the body of the card which does not require the body of the card to be machined to accurate dimensions, while still making it easy to control card deformation during the implantation of the electronic module therein.

SUMMARY OF THE INVENTION

The present invention provides a method of providing an electronic memory card comprising a body made of a thermoplastic material and having two main faces which are substantially parallel to each other, and an electronic module comprising:

a support which is generally flat in shape having two main faces;

contact tabs disposed on a first one of said main faces of said support;

a semiconductor chip having an integrated circuit formed therein and disposed on the second main face of said support; and electrical connections for connecting the terminals of said chip to said tabs, said method comprising the following steps:

(a) a cavity is made in the body of said card, said cavity including a first hollow opening out into a first one of said main faces of said body and having a bottom which is substantially parallel to said main faces of said body, and a second hollow opening out into said bottom, said first and second hollows having dimensions in planes parallel to said main faces of said body which are greater respectively than the dimensions of said insulating support and the dimensions of said chip, said bottom having a plurality of bumps projecting into said first hollow and separated from one another and from said second hollow by intercommunicating interstices, the distances between said first main face of the body and said bottom and the tops of said bumps being respectively greater than and less than the thickness of said support;

(b) said module is placed in said cavity in such a manner as to cause said chip to penetrate partially into said second hollow and to cause said support to penetrate partially into said first hollow, the portion of said support which is not covered by said chip resting on said bumps;

(c) said bumps are locally raised to their softening temperature and pressure is applied to said electronic module to crush the tops of said bumps until said contact tabs are substantially in the same plane as said main face of said body, said support thus adhering to said bumps; and (d) an insulating glue is caused to penetrate at least into said interstices between said bottom and said insulating support in order to provide additional adherence between said electronic module and said card body.

It can be seen that such a method provides an effective solution to the two above-specified conditions. Firstly there is no need to machine the initial cavity in the body of the card to a high degree of accuracy since accurate positioning of the electronic module relative to the body of the card is provided by the degree to which the tops of the bumps provided in the cavity are, in fact, crushed. It can also be seen the creep resulting from the bumps being crushed in entirely localized in the spaces between the bumps. Furthermore, since the crushing is limited, the volumes of material subjected to creep are small. It may also be observed that the set of bumps defines channels for glue insertion which encourage glue spreading by capillarity while limiting glue advance to the space lying between the insulating support of the electronic module and the face of the cavity which includes the bumps.

In a first implementation, the second hollow also opens out into the second main face of the card, and step (d) is performed after step (c).

In a second implementation of the invention, the second cavity is a blind hole and a drop of glue is placed therein between steps (b) and (c).

The invention also provides electronic memory cards having a structure of the type which is obtained by performing the above-defined method in accordance with one of its various possible implementations.

BRIEF DESCRIPTION OF THE DRAWINGS

Implementations of the invention are described by way of example with reference to the accompanying drawings, in which:

FIGS. 2 to 5 show the various operations performed on the body of the card in order to prepare it for the implantation of a module in accordance with a first implementation of the invention;

FIGS. 6 and 7 show steps of the first implementation of the method where the electronic module is placed in the cavity provided by the steps illustrated in FIGS. 2 to 5;

FIG. 8 shows the final structure of a card made in accordance with a first implementation of the invention, with the electronic module being fixed in its cavity; and FIGS. 9 to 12 illustrate a second implementation of the method in accordance with the invention. These figures show successive steps of the second implementation, with FIGS. 10 to 12 being vertical section views and with FIG. 9 being a plan view of a portion of the card seen from above.

DETAILED DESCRIPTION OF PREFERRED IMPLEMENTATIONS OF THE INVENTION

Figure 1:
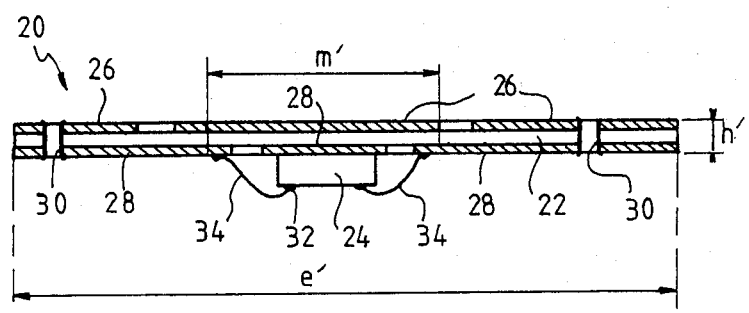
FIG. 1 is a vertical section through an electronic module suitable for being implanted in the body of a card.

Reference is made initially to FIG. 1 in order to describe an electronic module usable in the invention. The electronic module 20 is essentially constituted by an insulating support 22 made, for example, from the material sold under the trademark Mylar, or from any other insulating material. The support 20 supports a semiconductor chip having an integrated circuit 24 provided therein. Contact tabs 26 are provided on one of the faces of the insulating support 22 and the integrated circuit 24 is located on the opposite face. In order to make the various connections between the integrated circuit 24 and the contact tabs 26, the second face of the insulating support 22 is fitted with metallization 28 for providing electrical connections. In addition, plated-through holes such as 30 provide electrical connection between the conductor tracks 28 and the contact tabs 26. Finally, the conductive tracks 28 are connected to terminals such as 32 of the integrated circuit 24 by means of conductor wires such as 34.

In a first implementation of the invention, the electronic module 20 is implanted in the body of the card by means of steps which are now described with reference to FIGS. 2 to 8. The electronic module itself is described in greater detail in the above-mentioned European patent application.

As can be seen in FIG. 2, the starting material is a card body 40 made of a plastic material such as PVC and including an upper hollow 42 at the location where the electronic module is to be implanted. The body of the card is generally rectangular in shape and is delimited by two main parallel faces, namely a top face 44 and a bottom face 45. The bottom 46 of the hollow 42 is substantially parallel to the top face 44 of the body 40. This hollow opens out into the top face 44 of the card, i.e. into the face which is to include the tabs for electrical connection to a card reader. The hollow 42 may be circular, for example, and has a dimension e in the plane of the top face 44 which is slightly greater than the corresponding dimension e' of the insulating support of the electronic module. The depth h of the hollow 42 between the top face 44 of the card body and the bottom 46 of the hollow 42 is a little greater than the thickness h' of the assembly constituted by the insulating substrate of the electronic module together with the metallizations provided thereon. In the following steps (see FIG. 3) the bottom 46 of the hollow 42 is locally plastically deformed in order to create a set of bumps such as 50. These bumps are formed in such a manner as to ensure that the average distance between the top face 44 of the card body and the top faces of the bumps 50 (marked 1 in FIG. 3) is less than the thickness h' of the electronic module support. As can be seen more clearly in FIG. 4, the bumps 50 have interstices 52 left therebetween, which interstices are in communication with one another. The bumps 50 are about 0.2 mm to about 0.3 mm high.

In the presently described implementation, these bumps are in the form of radial ribs 50 extending from the wall of the hollow 42 up to a common central portion 51. The bumps could be different in shape. For example they could be constituted by small pegs regularly distributed over the bottom 46 of the hollow 42.

In the following step (shown in FIG. 5) a bottom hollow 54 is drilled through from the top hollow 42 to the bottom face 45 of the card body. For example, this hollow may also be circular in section having a diameter m which is slightly greater than the largest dimension m' of the integrated circuit as fitted with its connection wires 34. As can be seen in FIG. 5, the dimension m is considerably less than the dimension e. Thus, the set of hollows 42 and 54 constitutes a cavity 58 which passes through the card body 40 from one face to the other and which includes a relatively large portion 42 and a relatively small portion 54, with these two portions being interconnected by the remaining portion of the bottom 46 of the top hollow 42, together with its bumps 50.

Reference is now made to FIGS. 6 to 8 while describing how an electronic module 20 is implanted in the card using a first implementation of the invention. In order to simplify these figures the electronic module 20 is shown therein as being constituted solely by its insulating support 22 and the electronic module 24, with the metallizations and other details being omitted. Further, in order to make the figures more clear, they are not to scale and the thicknesses are considerably exaggerated relative to dimensions in the plane of the card.

As can be seen in FIG. 6, the electronic module is placed in the cavity 58. More precisely, the insulating substrate 22 rests on the tops of the bumps 50 and the electronic module 24 penetrates partially into the bottom portion 54 of the cavity 58. In addition, the face of the electronic module bearing the contact tabs stands proud from the top face 44 of the card body.

In the next step, as shown in FIG. 7, the tops of the bumps 50 are raised to the softening temperature of the material from which they are constituted, i.e. to about 175° C., and simultaneously the module assembly is pressed against the tops of the bumps which have been raised to their softening temperature until the top face of the insulating substrate (i.e. the contact tabs thereon) becomes substantially level with the top face 44 of the card body. It will be understood that during this operation, creep occurs only in the material localized in the bumps, which material migrates to occupy a very small portion of the interstices 52 between the bumps. As a result all modification to the shape of the card body is limited to the portion of the card including the bumps, i.e. to an inside portion of the card. After deformation, the bumps 50 are about 0.03 to 0.05 mm high.

FIG. 7 also shows an assembly including a tool 80 for performing these two operations. The body of the card is placed on a base 82. The tool 80 includes a fixed portion 84 whose bottom face 86 rests against the top face 44 of the card body all around the cavity 58. The tool includes a moving portion 88 capable of sliding relative to the fixed portion 84 in a bore 89 along a direction F, i.e. in a direction perpendicular to the main faces of the card. The tool is essentially constituted by a bottom face 90 in contact with the insulating support 22 of the electronic module and a heater element is represented at 92 by a heater resistance. In addition, the moving portion 88 includes lugs 94 which come into abutment against an end-of-stroke bearing surface 98 provided on the fixed portion 84 of the tool 80. The heater resistance 92 is raised to a temperature of about 175° C., thereby heating the insulating substrate 22 and thus transmitting heat to the material constituting the bumps 50. In addition, the moving portion 88 serves to apply a degree of pressure against the electronic module 20. The stroke of the moving portion is limited by cooperation between the lugs 94 and the end-of-stroke bearing surface 98. These two parts are placed so that in the end-of-stroke position the top face of the insulating substrate 22 is substantially at the same level as the top face 44 of the card body. At the end of this step, the electronic module assembly is properly positioned relative to the card body. In addition, the partial melting of the tops of the bumps 50 in contact with the insulating substrate 22 provides a degree of adherence therebetween, thus providing at least temporary connection between the body 20 and the electronic module. In addition, in spite of the bumps 50 creeping, the interstices 52 all remain in communication with the cavity 58.

FIG. 8 shows the last step of the method. The card assembly including the electronic module 20 is turned over. This operation is made possible by virtue of the fact that the electronic module is already fixed to the card body by the partial melting of the bumps. A drop 100 of insulating epoxy glue is inserted into the cavity 58 under the effect of gravity. Capillarity causes the glue to penetrate into the interstices 52 between the bumps 50. However, one of the effects of the capillarity is to limit the progress of the glue to the zone line between the insulating support 22 and the bottom of the top cavity 42. There is thus no problem of the glue reaching the face 44 of the card or of its reaching face of the electronic module where it includes the contact tabs.

It can be seen from the above description that the method in accordance with the invention has numerous advantages over the prior art. There is no need for the card body to be machined to accurate dimensions in order to provide the cavity in which the electronic module is received. There is no need to pre-glue either the module or the cavity. There is thus no need to accurately control the quantity of glue which is used. The softening of the plastic material constituting the card body is very localized and affects only a very small volume of material. The resulting creep is thus highly localized and, in addition, does not affect the outside faces of the card whose dimensions are required to satisfy accurate standards.

A second implementation of the method in accordance with the invention is described with reference to FIGS. 9 to 12. In this implementation, unlike the first implementation described above, the electronic module is received in a blind cavity which does not open out into the bottom face of the card body, and this may be advantageous in some applications.

The method begins with a card body 120 identical to that shown in FIG. 2. The body has an upper hollow 122 which is rectangular in the present example, and which has a bottom 124 at a depth of about 200 μm. The card body has a top main face 126 into which the hollow 122 opens out and a bottom main face 128.

Bumps having the shape shown in FIG. 9 are then made to project into the hollow 122 from the bottom 124 thereof. The bumps are constituted by pegs such as 130 which are placed over the area of a rectangular together with a continuous surrounding rib 132, i.e. a rib constituting a closed loop and, in the present example, rectangular in shape when seen from above. The rib 132 completely surrounds the set of pegs 130. The bumps 130 and 132 are obtained by plastic deformation and their height is from 0.2 to 0.3 mm.

In the following steps a bottom hollow 134 is made in the middle of the bottom 124, and this hollow is blind, i.e. it does not open out into the bottom face 128 of the card body 120. The set of hollows 122 and 134 constitutes a cavity 136 for receiving the electronic module. FIGS. 9 and 10 show that inside the zone delimited by the rib 132, the pegs 130 leave interstices 138 between one another, with all of the interstices being in communication with the bottom hollow 134.

In this second implementation, an electronic module 140 is used as shown in FIG. 11. The electronic module 140 differs from the electronic module 120 shown in FIG. 1 by its insulating support 142 including a window 144 in which the semiconductor chip 146 is partially received. The back of the chip 146 is directly glued by means of a conductive glue to one of the metallizations 148 deposited on the top face of the insulating support 142 and constituting the tabs for connection to a card reader. The electrical connection between the terminals of the chip 146 and the other contact tabs 148 are provided by means of conductor wires 150, with metallizations 152 being deposited on the other face of the insulating support and with plated-through holes 154 passing through the entire thickness of the insulating support 142. A more detailed description of the electronic module 140 may be found in the above-mentioned European patent application. This particular structure for an electronic module has the advantage of reduced overall thickness.

The dimensions of the electric module 140 have the same relationship to the dimensions of the cavity 136 as have already been described with reference to the first implementation of the invention.

In the following step a drop 156 of epoxy glue is placed in the bottom hollow 134. The method then continues in exactly the same way as the first implementation of the invention as described with reference to FIGS. 6 and 7. The electronic module 140 is placed in the cavity 136 in such a manner as to cause the insulating support 142 to have its metallizations 152 resting on the tops of the bumps 130, 132.

Then, a tool identical to that shown in FIG. 7 is used to heat the electronic module 140 and to apply suitable pressure thereto for softening the bump-constituting material and for crushing the bumps in the manner described in detail with reference to FIG. 7. It should also be added (as can be seen in FIG. 11) that the rib 132 is placed so as to be located, in part, opposite to the plated-through holes 154 in the electronic module 140. When the rib 132 is crushed, plastic material rises (155) into at least a portion of each plated-through hole 154. This serves to improve the connection between the module and the card body.

Figure 12:
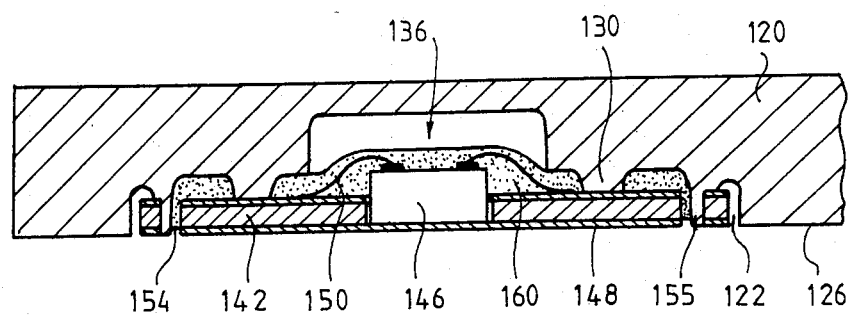

In a final step, the electronic module is finally glued to the card body. This is done by turning the card over, as shown in FIG. 12. The bottom face 128 of the card body is then lightly heated level with the cavity 136 to about 40° C. This heating, together with the card being turned over, enables the drop of epoxy glue 156 to disperse and to cover the chip 146 and its wires 150, thereby mechanically consolidating them. In addition, the glue fills the interstices 138 between the insulating support 42 and the bottom 124 of the hollow 122 by virtue of capillarity. The progress of the glue is limited by the presence of the rib 132. At plated-through holes, progress of the glue is limited by surface tension due to said holes which are small in size and which are at least partially filled by plastic material 155.

Another way of providing gluing when using a blind cavity consists in providing two holes passing through the insulating support 142 of the electronic module at points located inside the rib 132. Glue is injected through one of these holes and the level of the glue in the cavity is observed through the other. When the glue is level with the outside face of the insulating substrate in the second hole, glue injection is stopped. On solidifying, the glue fills the cavity and closes both holes.

It will be understood that the second implementation of the method in accordance with the invention has the same advantages as the first implementation. The second implementation has the additional advantage of leaving the back of the card intact. Further, the presence of a continuous rib 132 as one of the bumps ensures that none of the glue rises towards the top face 126 of the card since the rib constitutes a continuous barrier opposing glue advance.

It must also be understood that the special shape of the bumps 130 and 132 shown in FIGS. 9 and 10 could be used in the first implementation instead of the radial ribs 50.

It must be emphasized that the method has numerous advantages relative to prior methods. Firstly the fixing of an electronic module in the card is improved since it is obtained both by the presence of the glue and by adherence of the plastic material to the module. Further, the final size of the contact tabs relative to the top face of the card body can be accurately controlled regardless of the characteristics of the plastic material constituting the card.

What is claimed is:

1. A method of providing an electronic memory card comprising a body made of a thermoplastic material and having two main faces which are substantially parallel to each other, and an electronic module comprising:
    a support which is generally flat in shape having two main faces;
    contact tabs disposed on a first one of said main faces of said support;
    a semiconductor chip having an integrated circuit formed therein and disposed on the second main face of said support; and
    electrical connections for connecting the terminals of said chip to said tabs, said method comprising the following steps:
    (a) a cavity is made in the body of said card, said cavity including a first hollow opening out into a first one of said main faces of said body and having a bottom which is substantially parallel to said main faces of said body, and a second hollow opening out into said bottom, said first and second hollows having dimensions in planes parallel to said main faces of said body which are greater respectively than the dimensions of said insulating support and the dimensions of said chip, said bottom having a plurality of bumps projecting into said first hollow and separated from one another and from said second hollow by intercommunicating interstices, the distances between said first main face of the body and said bottom and the tops of said bumps being respectively greater than and less than the thickness of said support;
    (b) said module is placed in said cavity in such a manner as to cause said chip to penetrate partially into said second hollow and to cause said support to penetrate partially into said first hollow, the portion of said support which is not covered by said chip resting on said bumps;
    (c) said bumps are locally raised to their softening temperature and pressure is applied to said electronic module to crush the tops of said bumps until said contact tabs are substantially in the same plane as said main face of said body, said support thus adhering to said bumps; and
    (d) an insulating glue is caused to penetrate at least into said interstices between said bottom and said insulating support in order to provide additional adherence between said electronic module and said card body.

2. A method according to claim 1, wherein step (c) is performed by heating said support to bring said bumps to their softening temperature and by simultaneously applying pressure to said insulating support.

3. A method according to claim 1, wherein said second hollow also opens out into said second main face of said body.

4. A method according to claim 3, wherein step (d) is performed by inserting insulating glue via said second hollow, which glue penetrates by capillarity into said interstices between said support and said bottom.

5. A method according to claim 1, wherein step (a) is performed by initially providing said first hollow, then forming said bumps on its bottom, and then providing said second hollow.

6. A method according to claim 1, wherein said second hollow is blind.

7. A method according to claim 6, wherein insulating glue is deposited in said second hollow prior to step (b) and wherein step (d) is performed by turning the card over so that said second hollow is above said first hollow and by heating said second face of said card body over said second hollow.

8. A method according to claim 1, wherein said bumps comprise a rib disposed in a closed loop and a plurality of pegs projecting from that portion of said bottom which is situated between said rib and said second hollow.

9. A method according to claim 3, wherein said projections comprise a rib disposed in a closed loop and a plurality of pegs projecting from that portion of said bottom which is situated between said rib and said second hollow.

10. An electronic memory card comprising:
a body made of thermoplastic material and having a cavity constituted by a first hollow opening out into a first main face of the card body and a second hollow opening out into the bottom of said first hollow;
an electronic module lodged in said cavity, said module comprising an insulating support situated in said first hollow and having contact tabs on its outside face disposed substantially in the same plane as said first main face of said card body, and provided with a semiconductor chip on its inside face, together with electrical connections; and
a plurality of bumps projecting from said bottom and adhering to said inside face of said support, the space lying between said bottom, said support, and said bumps, being substantially filled with an insulating glue.

11. A card according to claim 10, wherein said second hollow is blind and wherein said glue also covers, at least partially, said chip and said connections.

12. A card according to claim 10, wherein said second hollow opens out into the second main face of said card body, with the portion of said second hollow which is not occupied by said chip being filled with said insulating glue.

13. A card according to claim 10, wherein said bumps comprise a rib disposed along a closed loop together with a plurality of pegs projecting from the portion of said bottom of said first hollow which is situated between said second hollow and said rib.

* * * * *